United States Patent [19]

Ogawa et al.

[11] Patent Number: 5,405,800
[45] Date of Patent: Apr. 11, 1995

[54] METHOD OF FABRICATING A SEMICONDUCTOR MEMORY DEVICE

[75] Inventors: Hisashi Ogawa; Susumu Matsumoto; Shin Hashimoto, all of Osaka; Hiroyuki Umimoto, Hyogo, all of Japan

[73] Assignee: Matsushita Electric Industrial Co., Ltd., Kadoma, Japan

[21] Appl. No.: 274,048

[22] Filed: Jul. 12, 1994

[30] Foreign Application Priority Data

Jul. 13, 1993 [JP] Japan .................................. 5-173098

[51] Int. Cl.⁶ ............................................. H01L 21/70
[52] U.S. Cl. ........................................ 437/52; 437/48; 437/228; 437/229
[58] Field of Search ....................... 437/47, 48, 52, 60, 437/228, 229, 919

[56] References Cited

U.S. PATENT DOCUMENTS

| | | | |
|---|---|---|---|
| 4,882,289 | 11/1989 | Moriuchi et al. | 437/60 |
| 5,135,881 | 8/1992 | Sacki | 437/52 |
| 5,188,975 | 2/1993 | Kojima et al. | 437/60 |
| 5,320,976 | 6/1994 | Chim et al. | 437/48 |

FOREIGN PATENT DOCUMENTS

| | | |
|---|---|---|
| 4-82263 | 3/1992 | Japan . |
| 5-299599 | 11/1993 | Japan . |
| 5-335297 | 12/1993 | Japan . |

*Primary Examiner*—Tom Thomas
*Attorney, Agent, or Firm*—Willian Brinks Hofer Gilson & Lione

[57] ABSTRACT

A method of fabricating a semiconductor memory device on a semiconductor substrate is disclosed. A gate electrode that becomes a word line, a bit line, and a charge-storage electrode are formed in a memory cell array region of a semiconductor substrate. A capacitor insulator layer and a plate electrode are formed in that order. Then, a BPSG film is formed in the memory cell array region and in the peripheral circuit region. A resist pattern is formed on the BPSG film, leaving the memory cell array region exposed. Using the resist pattern thus formed as a mask, an etching treatment is applied to remove an upper surface portion of the BPSG film lying within the memory cell array region by a given amount. After the resist pattern is removed, the BPSG film is heated in order that it reflows to planarize.

11 Claims, 19 Drawing Sheets

DISTANCE X (μm) BETWEEN MEMORY CELL ARRAY END AND RESIST PATTERN

METHOD OF FABRICATING A SEMICONDUCTOR MEMORY DEVICE

BACKGROUND OF THE INVENTION

This invention in general relates to semiconductor memories, and more specifically to a dynamic random access memory (DRAM) made up of stacked memory cells.

Recently, the scale of semiconductor memory integration has increased remarkably. Of all the forms of semiconductor memory, DRAMs require the finest fabrication processing, and it is necessary for DRAMs to have appropriate storage capacitors having the ability of storing sufficient electric charge. Trench memory cells and stacked memory cells are widely used for DRAM. A trench memory cell utilizes a hole formed in a semiconductor substrate for forming a charge-storage electrode. In a stacked memory cell, on the other hand, a charge-storage electrode three-dimensionally "stacks" on a semiconductor substrate. The continuous miniaturization of semiconductor memory dimensions, however, produces problems to the stacked memory cell, such as difficultly in storing a sufficient amount of electric charge. To cope with this problem, charge-storage electrodes must stand high, that is, the height of the charge-storage electrode increases.

In creating required patterns by means of lithography, the depth of focus becomes "shallower" as the limit of resolution becomes lower. Generally, the limit of resolution varies with the wavelength of a light source used, and varies inversely with the numerical aperture of a lens used in the lithographic exposure tool. Therefore, in order to create fine patterns, it is necessary either to use a light source with a shorter wavelength or to increase the numerical aperture of a lens.

The depth of focus, on the other hand, varies with the wavelength of a light source, and varies inversely with the square of the numerical aperture of a lens. This means that the depth of focus becomes shallower as the limit of resolution becomes lower. Therefore, it is necessary to planarize the semiconductor substrate so as to form a fine pattern.

Referring now to FIGS. 16 and 17, the fabrication of a conventional DRAM employing stacked memory cells is described.

FIGS. 16 and 17 each illustrate in cross section a step of the fabrication of a conventional stacked memory cell type DRAM. As shown in FIG. 16, an insulator layer 2 for isolation between devices is formed on a p-type semiconductor substrate 1. Then, a gate insulator layer 4 constituting a switching transistor and a gate electrode 5 (i.e. a word line) are formed. Next, a bit line 6 is formed in an n-type diffused layer 3 provided on one side of the gate electrode 5, and an insulator layer 20 is formed all over the semiconductor substrate 1. Thereafter, a contact hole 20a is formed in the insulator layer 20 down to an n-type diffused layer 3 provided on the other side of the gate electrode 5 and then a charge-storage electrode 7 of p-doped polysilicon is formed in the same n-type diffused layer 3.

As shown in FIG. 17, a capacitor insulator layer 8, made up of a silicon nitride layer and a silicon dioxide layer, is formed on the charge-storage electrode 7 and on the insulator layer 20, and a plate electrode 9 is formed on the capacitor insulator layer 8. A BPSG film 10 (i.e., an interlayer insulator) is deposited on the plate electrode 9. The BPSG film 10 is subjected to a heat treatment. The BPSG film 10 reflows upon heating. In this way, the BPSG film 10 is planarized.

In spite of such a planarization process, there still exists an absolute level difference 15 between a memory cell array region 40 and a peripheral circuit region 30 of the semiconductor substrate 1. The absolute level difference 15 agrees with the sum of the charge-storage electrode's 7 height and the plate electrode's 9 film thickness. It is said that a 64M DRAM requires a storage capacitor with a capacitance of about 30 fF. Therefore, for the case of a memory cell array with an area of 1.5 $\mu m^2$, the charge-storage electrode 7 must stand about 800 nm if a capacitor insulator layer equivalent to a 6-nm silicon dioxide layer is used.

The above-described organization presents some problems. For example, if a 200-nm polysilicon layer as the plate electrode 9 is used, this creates, between the memory cell array region 40 and the peripheral circuit region 30, a steep side 35 causing about 1 $\mu m$ of level difference equivalent to the sum of the charge-storage electrode's 7 height and the plate electrode's 9 film thickness. As a result, the formation of wiring patterns at later stages becomes difficult. A 64M DRAM requires 0.35-$\mu m$ pattern formation. However, the depth of focus becomes shallower as required patterns become finer, when photolithography is used. In other words, it is difficult to form a fine pattern on the steep side 35.

FIG. 18 shows in cross section a step. A contact hole 16 is formed which passes through the insulator layer 20 and the BPSG film 10. Then, a tungsten 17 is deposited on the entire surface of the BPSG film 10, as a result of which the contact hole 16 is filled with the tungsten 17. The tungsten 17 deposited on the surface is etched back so that the tungsten 17 remains only in the contact hole 16.

The tungsten 17 is deposited in a perpendicular direction to the BPSG film 10. The film thickness ($t_2$) of the tungsten 17 at the steep side 35, measured in a perpendicular direction to the semiconductor substrate 1, can be written $t_2 = t_1/\cos\theta$ where $t_1$ is the film thickness of the tungsten 17 at the BPSG film's 10 flat surface and $\theta$ is the maximum tilt angle (hereinafter called the flow angle) of the steep side 35 defined between the memory cell array region 40 and the peripheral circuit region 30. It is necessary to etch back the tungsten 17 by a proportional amount to the film thickness $t_2$ in order to remove the tungsten 17 at the steep side 35. That is, the flow angle $\theta$ increases as the tungsten 17 held in the contact hole 16 is trenched down deeper. This results in the drop in contact reliability.

FIG. 19 shows a resist layer 19 used for patterning a metal layer 19 of Al, Si, and Cu deposited on the BPSG film 10. In FIG. 19, $T_1$ represents the film thickness of the resist layer 19 at the center of the memory cell array region 40, $T_2$ represents the film thickness of the resist layer 19 at one end of the memory cell array region 40, and $T_3$ represents the film thickness of the resist layer 19 at the steep side 35 between the memory cell array region 40 and the peripheral circuit region 30. The differences between $T_1$, $T_2$, and $T_3$ increase as the flow angle $\theta$ increases. This causes considerable variations in dimensions when patterning the resist layer 19 by photolithography.

SUMMARY OF THE INVENTION

Bearing in mind the above-described problems accompanied with the prior art techniques, the present invention was made. It is a main object of the present invention to provide an improved semiconductor memory fabrication technique. With this technique of the present invention, the absolute level difference and flow angle of a steep side created between a memory cell array region and a peripheral circuit region can be controlled advantageously even if charge-storage capacitors have to stand tall. This makes the formation of wiring patterns being carried out at a later stage much easier. Contact reliability can be improved. Additionally, it is possible to control variations in dimensions when forming a resist pattern.

The present invention discloses a first method of fabricating a semiconductor memory device. The first method comprises: (a) a first step of forming a word line, a bit line, and a charge-storage electrode in a memory cell array region which is formed on a semiconductor substrate; (b) a second step of forming a plate electrode over the charge-storage electrode wherein a capacitor insulator layer is sandwiched between the charge-storage electrode and the plate electrode; (c) a third step of forming an interlayer insulator that flows upon heating on the memory cell array region as well as on a peripheral circuit region which is formed on the semiconductor substrate; (d) a fourth step of forming a resist pattern on the interlayer insulator, leaving the memory cell array region exposed; (e) a fifth step of etching the interlayer insulator using the resist pattern as a mask so as to remove an upper surface portion of the interlayer insulator in the memory cell array region; and (f) a sixth step of, after removing the resist pattern, subjecting the interlayer insulator to a heat treatment in order that the interlayer insulator fellows.

In accordance with the first method, the aforesaid resist pattern with an opening that exposes the memory cell array region is used as a mask when removing the upper surface portion of the interlayer insulator by etching, and the interlayer insulator is made by a heat treatment to fellow. The film thickness of the interlayer insulator lying within the memory cell array region becomes thinner, by an amount equivalent to such a removed portion, than the film thickness of the interlayer insulator lying with the peripheral circuit region. As a result, the absolute level difference and flow angle of the steep side is decreased. In stacked memory cell-type DRAM fabrication, the formation of wiring patterns being carried out at a later stage becomes much easier. Contact reliability can be improved. Additionally, it is possible to control variations in dimensions when forming a resist pattern. Conventional memory cell arrays must have a complicated structure so as to prevent their charge-storage electrodes from standing high. Conversely, the present invention makes it possible to secure appropriate capacitance with a simpler organization even when a charge-storage electrode has to stand tall. This contributes to reducing the number of fabrication steps, provides fabrication latitude, and improves the yield of DRAM.

In the first method, it is preferable that the fourth step includes a step of forming the resist pattern in such a way that the interlayer insulator, which lies in the peripheral circuit region and which is formed at the fifth step, has at the edge thereof a projection that surrounds the memory cell array region.

As a result of such arrangement, when causing the interlayer insulator to fellow, the projection flows into the steep side between the memory cell array region and the peripheral circuit region and into the peripheral circuit region, thereby increasing the width of the steep side and thus decreasing the flow angle thereof. Therefore, contact reliability increases.

It is preferable that such a fourth step includes a step of forming the resist pattern in such a way that the projection is spaced from the memory cell array region at the fifth step.

Such arrangement keeps the projection from flowing into an etched area. This further reduces the flow angle and improves contact reliability.

In the first method, it is preferable that the fourth step includes a step of forming the resist pattern in such a way that the interlayer insulator, which lies in the peripheral circuit region and which is formed at the fifth step, has at the edge thereof a recess that surrounds the memory cell array region.

As a result of such arrangement, the steep side flows into the recess, and at the same time the edge of the interlayer insulator of the memory cell array region, too, flows in the direction of the steep side. This increases the width of the steep side, therefore reducing the flow angle thereof. This results in improving contact reliability.

It is preferable for such a fourth step to include a step of forming the resist pattern in such a way that the recess is spaced from the memory cell array region at the fifth step.

As a result of such arrangement, the steep side flows not in the direction of the memory cell array region but in the direction of the peripheral circuit region. This increases the width of the steep side, therefore reducing the flow angle thereof. Contact reliability improves.

The present invention discloses a second method of fabricating a semiconductor memory. The second method comprises: (a) a first step of forming a word line, a bit line, and a charge-storage electrode in a memory cell array region which is formed on a semiconductor substrate; (b) a second step of forming a plate electrode over the charge-storage electrode wherein a capacitor insulator layer is sandwiched between the charge-storage electrode and the plate electrode; (c) a third step of forming a resist pattern on the plate electrode, leaving a peripheral circuit region which is formed on the semiconductor substrate exposed; (d) a fourth step of forming an insulator layer used for a reduction in level difference in the peripheral circuit region using the resist pattern as a mask; (e) a fifth step of, after removing the resist pattern, forming an interlayer insulator that flows upon heating on the memory cell array region as well as on the peripheral circuit region; and (f) a sixth step of subjecting the interlayer insulator to a heat treatment in order that the interlayer insulator fellows.

In accordance with the second method, the peripheral circuit region is previously raised in height, so that the absolute level difference and flow angle of the steep side decreases. This produces the following advantages. In stacked memory cell-type DRAM fabrication, the formation of wiring patterns being carried out at a later stage becomes much easier. Contact reliability can be improved. Additionally, it is possible to control variations in dimensions when forming a resist pattern.

The present invention discloses a third method of fabricating a semiconductor memory device. The third method comprises: (a) a first step of forming a word line, a bit line, and a charge-storage electrode in a memory cell array region which is formed on a semiconductor substrate; (b) a second step of forming an insulator layer that becomes a capacitor insulator layer in the memory cell array region as well as in a peripheral circuit region which is formed on the semiconductor substrate, and forming a conductive layer that becomes a plate electrode on the insulator layer; (c) a third step of forming a plate electrode formation resist pattern on the conductive layer, leaving the peripheral circuit region exposed; (d) a fourth step of etching the conductive layer using the resist pattern as a mask so as to form a plate electrode formed by the conductive layer; (e) a fifth step of forming an insulator layer used for a reduction in level difference in the peripheral circuit region using the resist pattern as a mask; (f) a sixth step of, after removing the resist pattern, forming an interlayer insulator that flows upon heating in the memory cell array region as well as in the peripheral circuit region; and (g) a seventh step of subjecting the interlayer insulator to a heat treatment in order that the interlayer insulator fellows.

In accordance with the third method, the peripheral circuit region is previously raised in height, so that the absolute level difference and flow angle of the steep side decreases. This produces the following advantages. In stacked memory cell-type DRAM fabrication, the formation of wiring patterns being carried out at a later stage becomes much easier. Contact reliability can be improved. Additionally, it is possible to control variations in dimensions when forming a resist pattern. Additionally, the resist pattern used to form a plate electrode serves also as a mask to form the level difference reduction insulator layer. This eliminates the need for forming a new resist pattern.

In each of the second and third methods, it is preferable that the level difference reduction insulator layer is a silicon dioxide layer formed by means of a liquid phase epitaxy method for ease of formation.

Further, in each of the second and third methods, it is preferable that the third step includes a step of forming the resist pattern in such a way that the interlayer insulator, which lies in the peripheral circuit region and which is formed at the fifth step, has at the edge thereof a recess that surrounds the memory cell array region. As a result of such arrangement, the edge of the memory cell array region flows in the direction of the steep side, thereby increasing the width of the steep side and reducing the flow angle thereof. This improves contact reliability to a further extent.

BRIEF DESCRIPTION OF THE DRAWINGS

FIGS. 12 to 1S show successive steps of the fabrication of a semiconductor memory device in accordance with a third embodiment of the present invention.

DETAILED DESCRIPTION OF THE INVENTION

Figure 1:
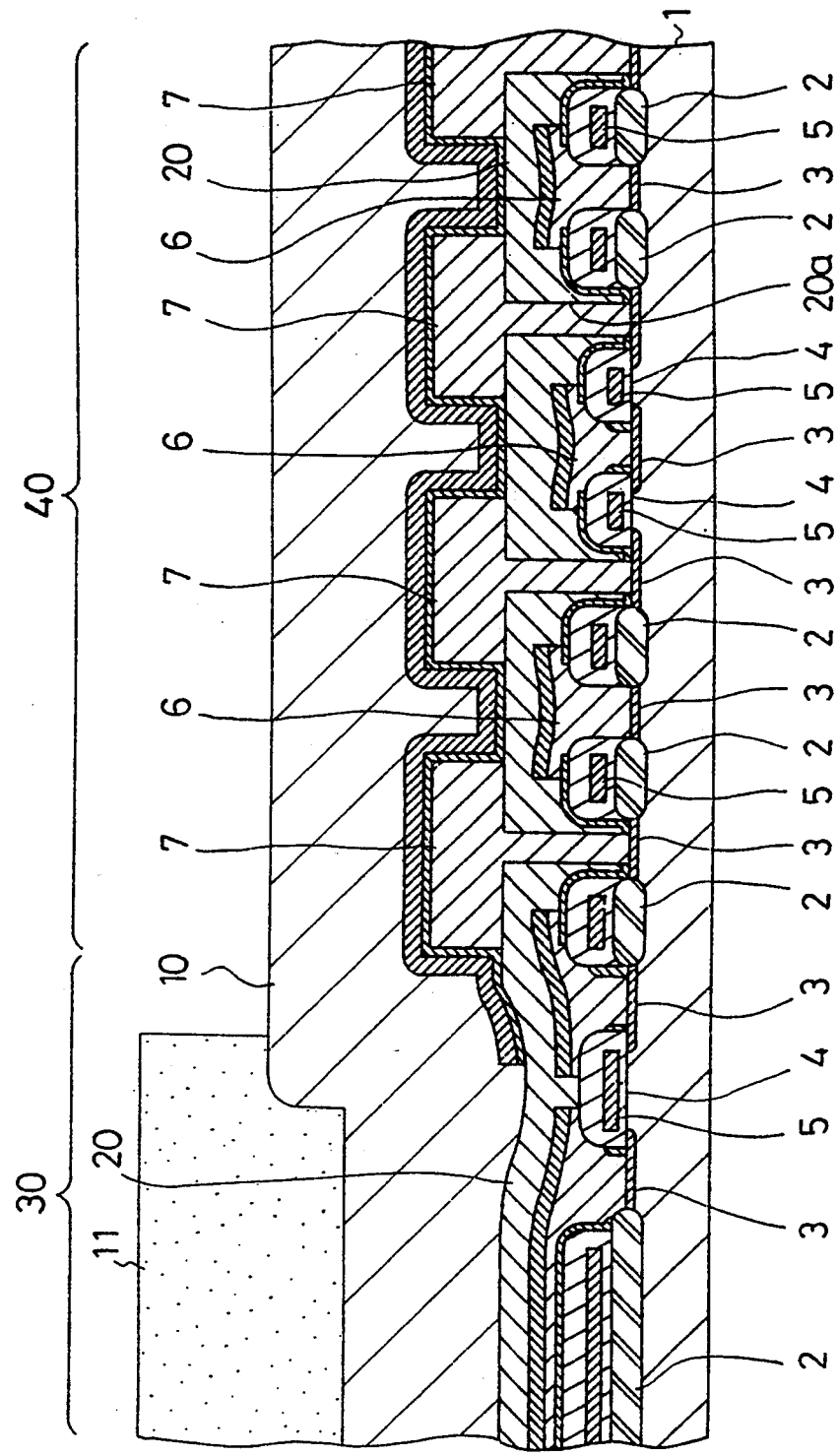
FIGS. 1 to 4 show successive steps of the fabrication of a semiconductor memory device in accordance with a first embodiment of the present invention.

Referring now to FIGS. 1 to 4, a first embodiment of the present invention is described.

FIGS. 1 to 4 show in cross section steps of the fabrication of a semiconductor memory device of the first embodiment.

In the first place, a silicon dioxide insulator layer 2 used for isolation between devices is formed, by means of a technique known in the art as the LOCOS method, on a p-type semiconductor substrate 1. Next, a gate oxide 4, a gate electrode 5 (i.e., a word line), and an n-type diffused layer 3 that constitutes a switching transistor is formed in a memory cell array region 40 (i.e., area defined on a surface of the semiconductor substrate 1). A bit line 6 being connected to an n-type diffused layer 3 provided on one side of the gate electrode 5 is formed, and an insulator layer 20 is formed on the transistor as well as on the bit line 6. A contact hole 20a is formed into the insulator layer 20 until it reaches an n-type diffused layer 3 provided on the other side of the gate electrode 5. A charge-storage electrode 7 of in situ p-doped polysilicon (hereinafter abbreviated DPS) is deposited by a CVD method to 800 nm high. A capacitor insulator layer 8 of $Si_3N_4$ and $SiO_2$ is formed. A plate electrode 9 of a DPS layer having a film thickness of 200 nm is then formed. A BPSG film 10 serving as an insulator layer which flows upon heating is deposited 1800 nm. Note that the film thickness of the BPSG film 10 must exceed the sum of the charge-storage electrode's 7 height and the plate electrode's 9 film thickness.

Next, a heat treatment is performed at a temperature of 850° C. in a nitrogen atmosphere for 15 minutes in order that the moisture contained in the BPSG film 10 vaporizes. A resist pattern 11 is formed on the BPSG film 10, leaving the memory cell array region 40 exposed. Preferably, the resist pattern 11 is formed such that the BPSG film 10 within the peripheral circuit region 30 has at its edge a projection 50 that surrounds the memory cell array region 40 (see FIG. 2).

Figure 2:
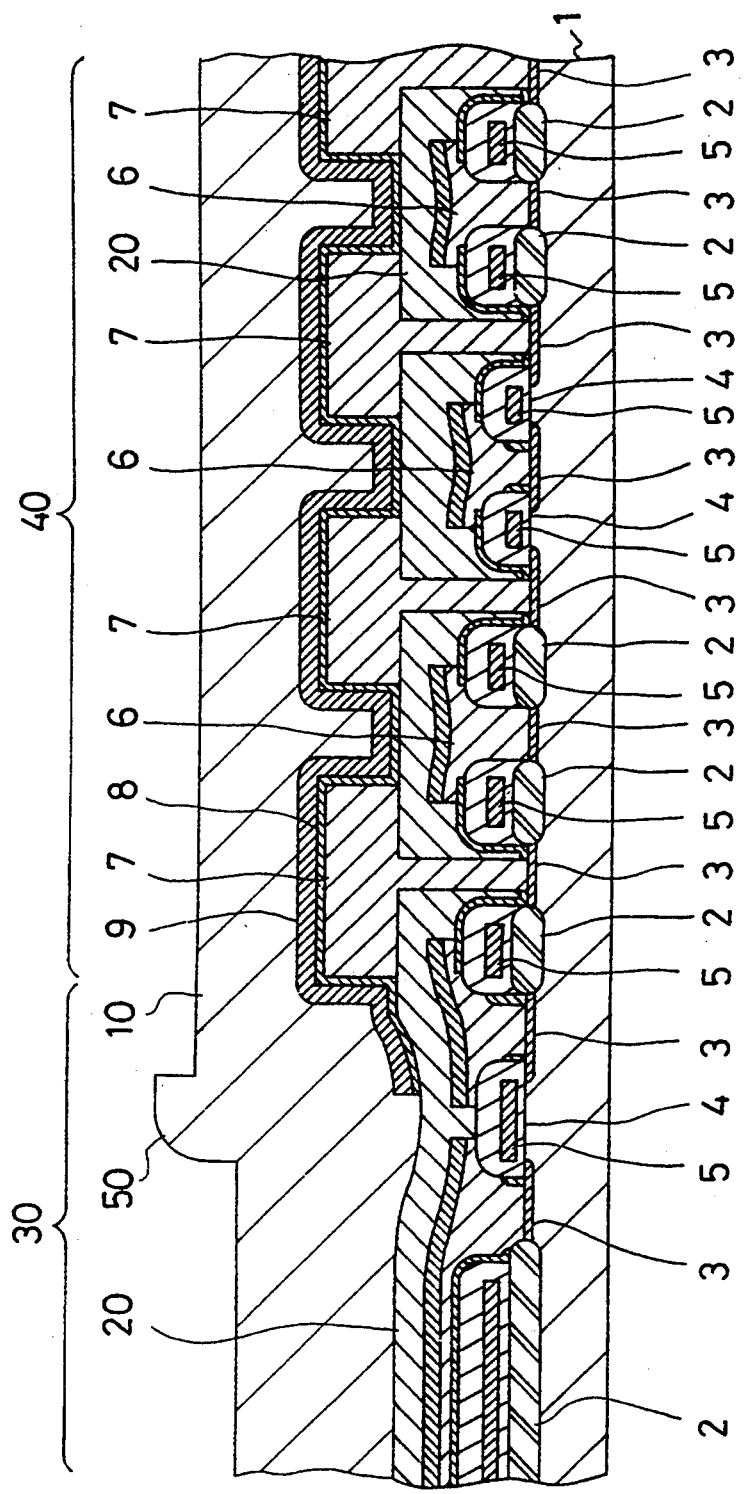

The BPSG film 10 within the memory cell array region 40 is etched 500 nm in thickness using the resist pattern 11 as a mask, and the above-described projection 50 is formed (see FIG. 2). After this, the resist pattern 11 is removed.

Figure 3:
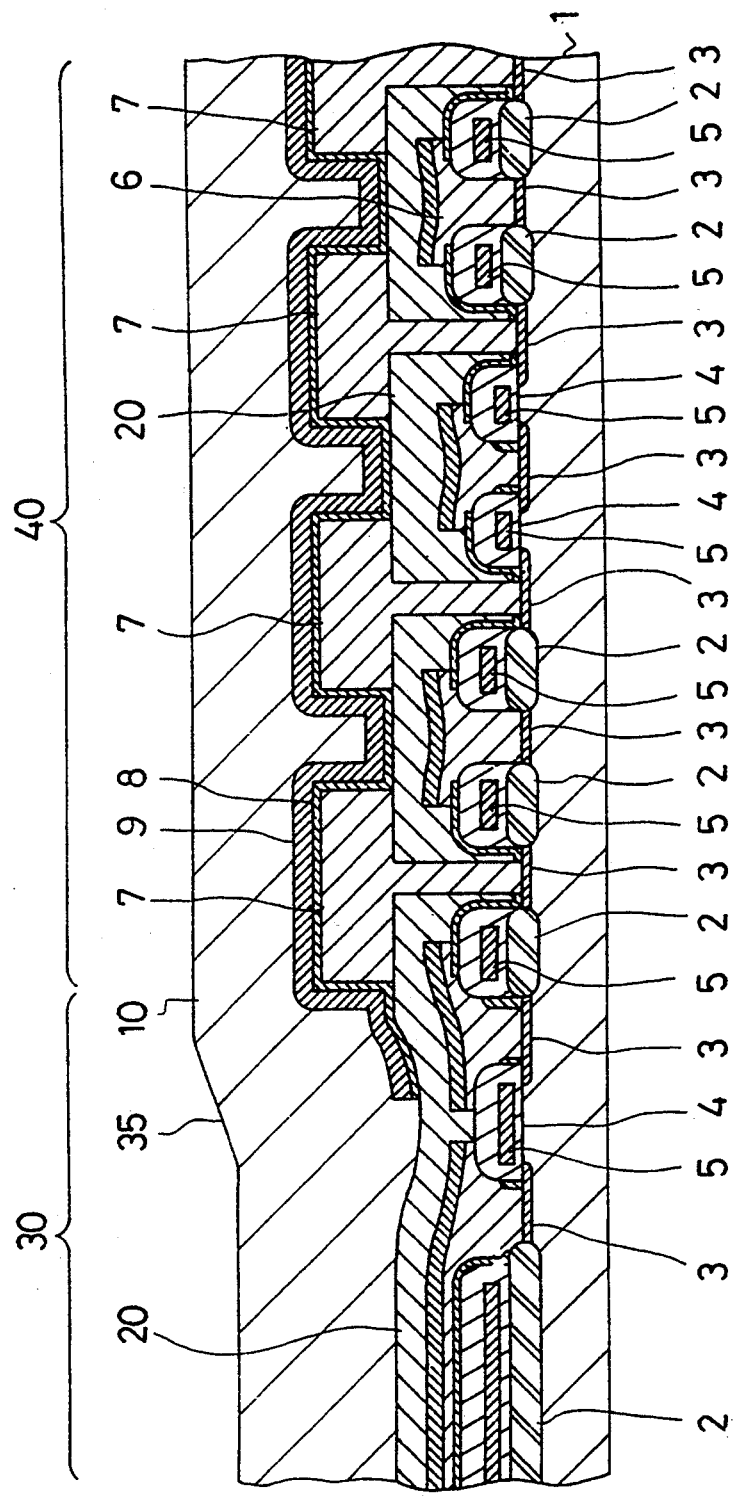

The BPSG film 10 is then subjected to a heat treatment at a temperature of 900° C. in a nitrogen atmosphere for 40 minutes, whereby the BPSG film 10 fellows to planarize (see FIG. 3).

Figure 4:
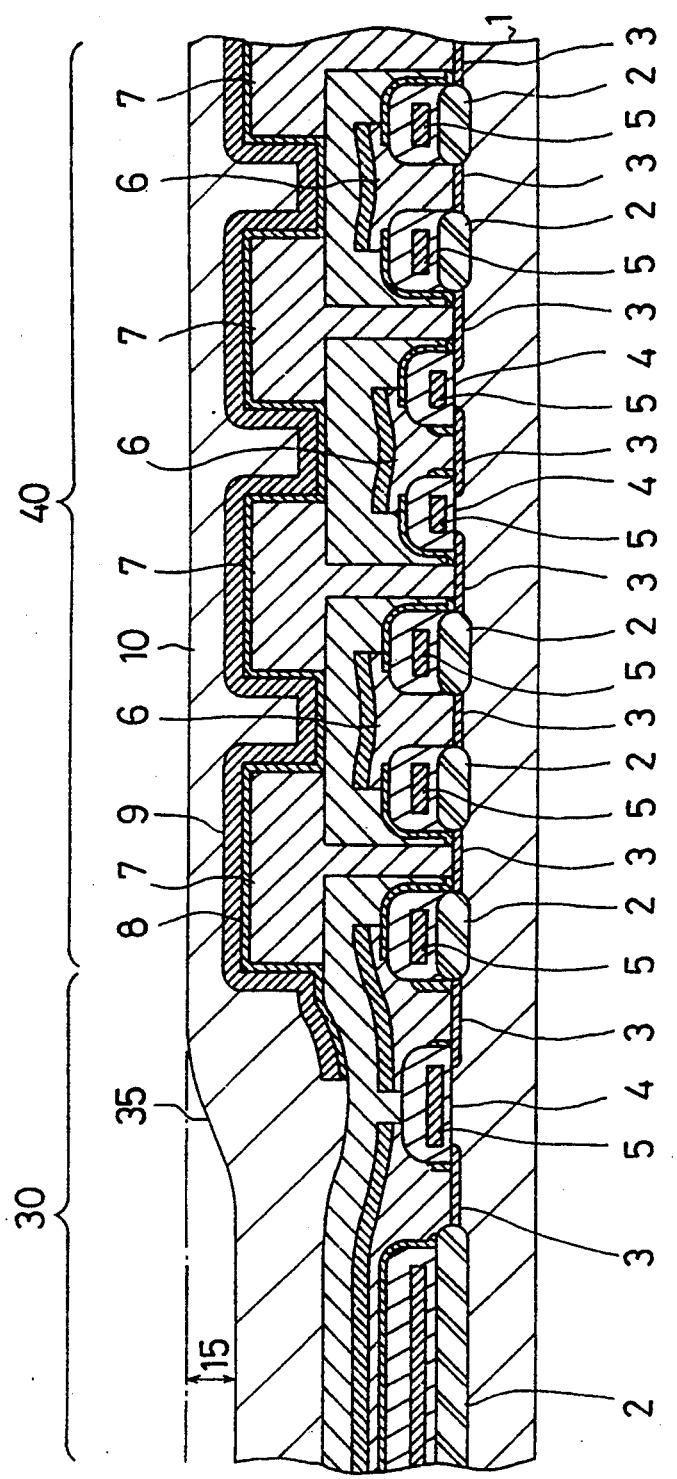

Next, as shown in FIG. 4, the BPSG film 10 is etched back 500 nm to form an interlayer insulator on the plate electrode 9.

In accordance with the above-described fabrication steps of the present embodiment, the absolute step difference 15 caused by the presence of the steep side 35 between the memory cell array region 40 and the peripheral circuit region 30 is reduced down to about 500 nm. This makes the formation of wiring patterns at later stages much easier. The absolute level difference 15 can be set to a desired value by modifying the charge-storage electrode's 7 height and the amount of etching on the BPSG film 10 of the memory cell array region 40.

Further, the BPSG film 10 is made to fellow, with the projection 50 still remained at the edge of the BPSG film 10 in the peripheral circuit region 30. This permits the steep side 35 between the memory cell array region 40 and the peripheral circuit region 30 to have a smaller flow angle.

The fabrication of a DRAM of the present embodiment is completed upon completion of metalization by a known technique.

In the first embodiment, the BPSG film 10 undergoes a heat treatment and then is etched back 500 nm. Such an etch-back amount is not to be considered restrictive. Any etch-back amount may be useful as long as it does not ill-influence the formation of metal contacts at a later stage. Additionally, the need for etch-back processing may be eliminated depending on the setting of the film thickness of the BPSG film 10..

Figure 5:
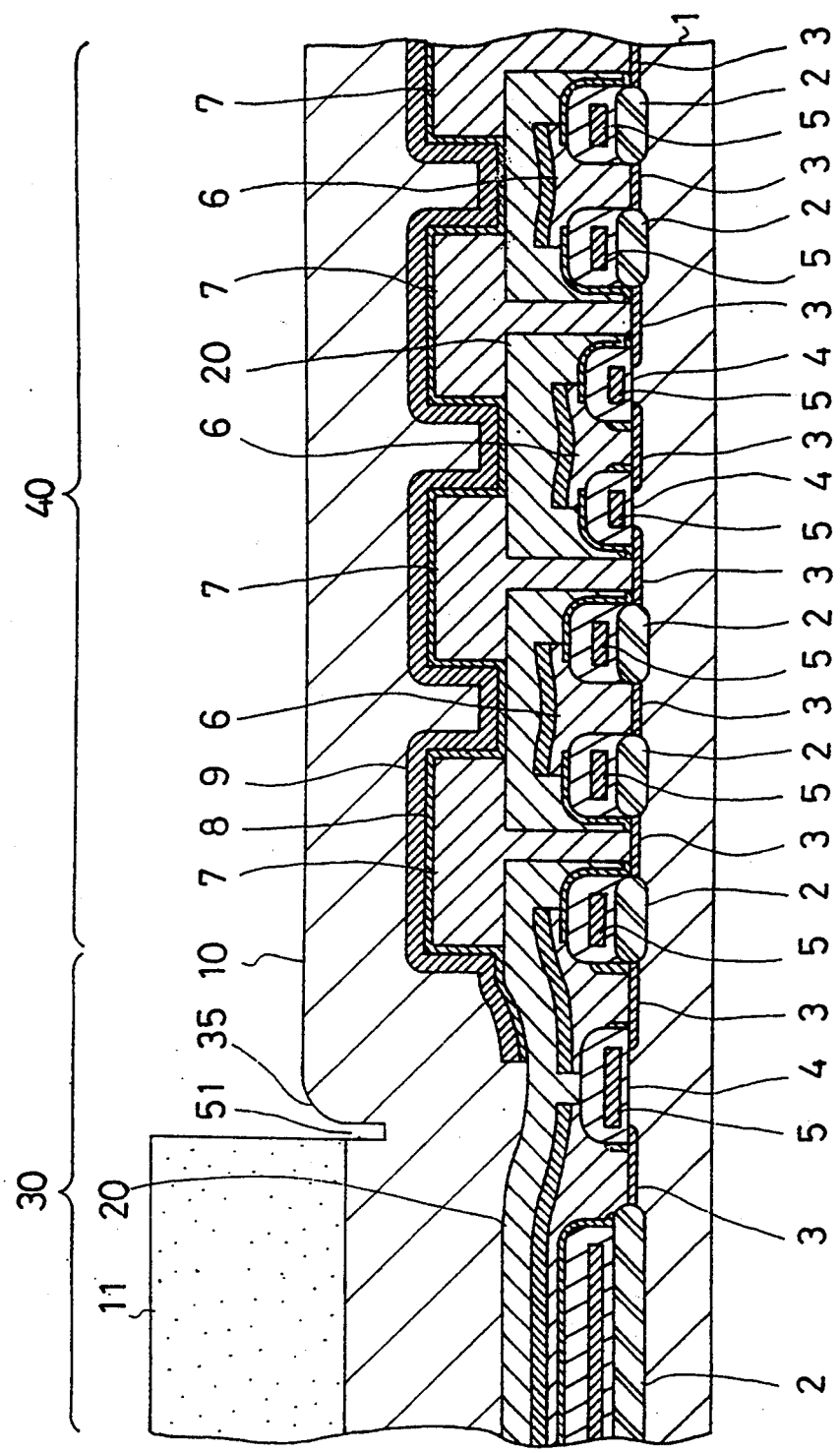
FIG. 5 shows a step of the fabrication of a semiconductor memory device in accordance with a modification of the first embodiment.

FIG. 5 shows a step of the fabrication of a semiconductor memory device in accordance with a modification of the first embodiment. As shown in FIG. 5, the resist pattern 11 is formed in such a way that the BPSG film 10 within the peripheral circuit region 30 has at its edge a recess 51 that surrounds the memory cell array region 40. The BPSG film 10 within the memory cell array region 40 is etched using the resist pattern 11. The steep side 35 then flows into the recess 51, and an edge portion of the BPSG film 10 of the memory cell array region 40 flows in the direction of the steep side 35. This reduces the flow angle of the steep side 35 (see FIG. 3).

Figure 6:
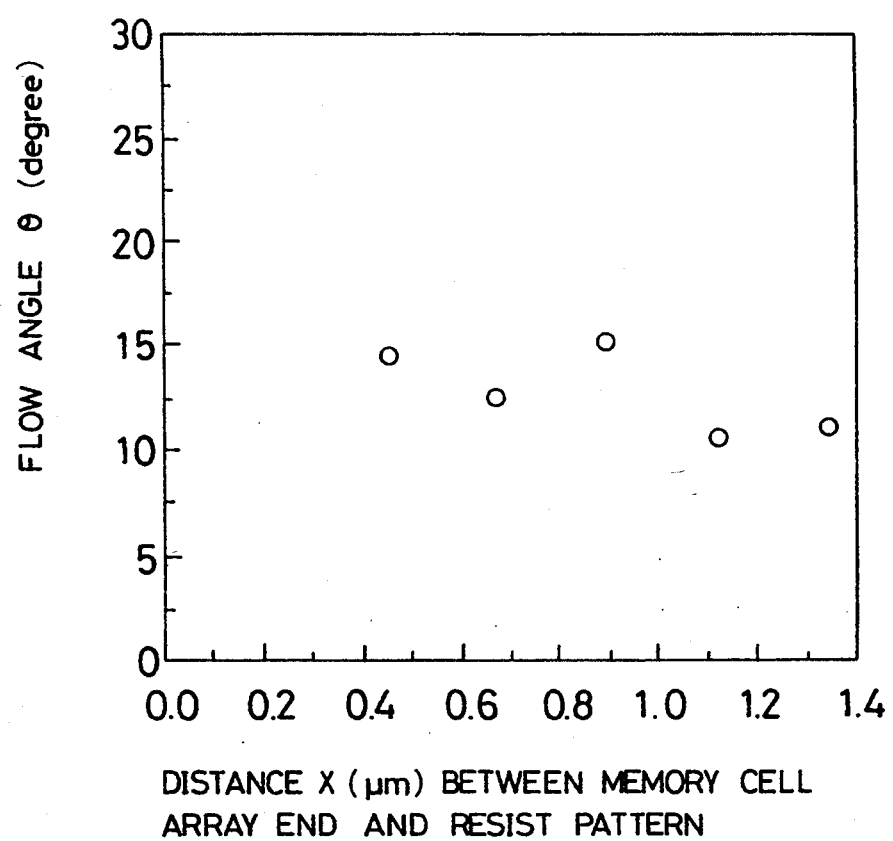
FIG. 6 is a graph showing the relationship of the distance from one end of a memory cell array region to a resist pattern versus the flow angle, in the first embodiment.

FIG. 6 is a graph showing the relationship of the distance x ($\mu$m) from one end of the memory cell array region 40 to the resist pattern 11 versus the flow angle $\theta$ (degree). As seen from FIG. 6, where the distance x falls within the 0.45–1.35 $\mu$m range, the flow angle $\theta$ is 15 degrees or less. The examination showed that the flow angle $\theta$ was 29.5 degrees if the BPSG film 10 within the memory cell array region 40 was heated at a temperature of 900° C. in a nitrogen atmosphere for 40 minutes, without an etching treatment.

Referring now to FIGS. 7–11, a second embodiment of the present invention is described.

FIGS. 7 to 11 show successive steps of the fabrication of a semiconductor memory device in accordance with the second embodiment.

Figure 7:
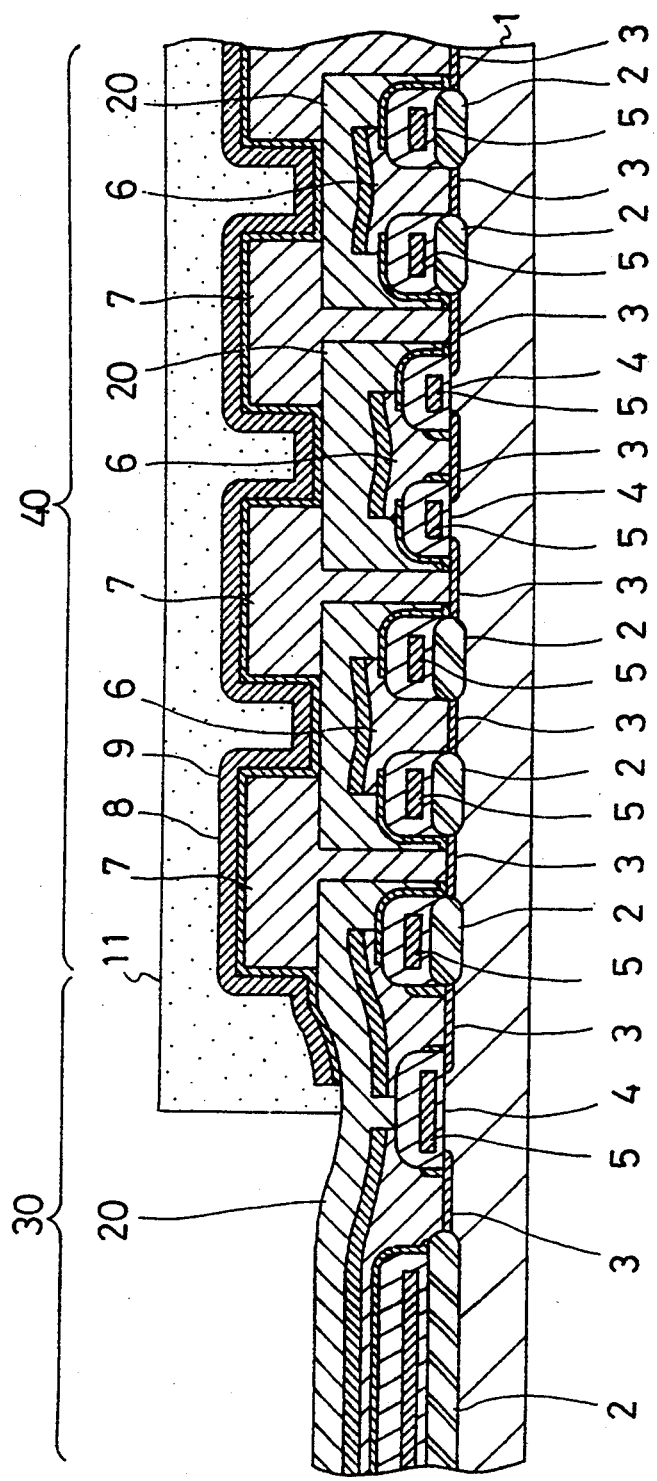
FIGS. 7 to 11 show successive steps of the fabrication of a semiconductor memory device in accordance with a second embodiment of the present invention.
Figure 8:
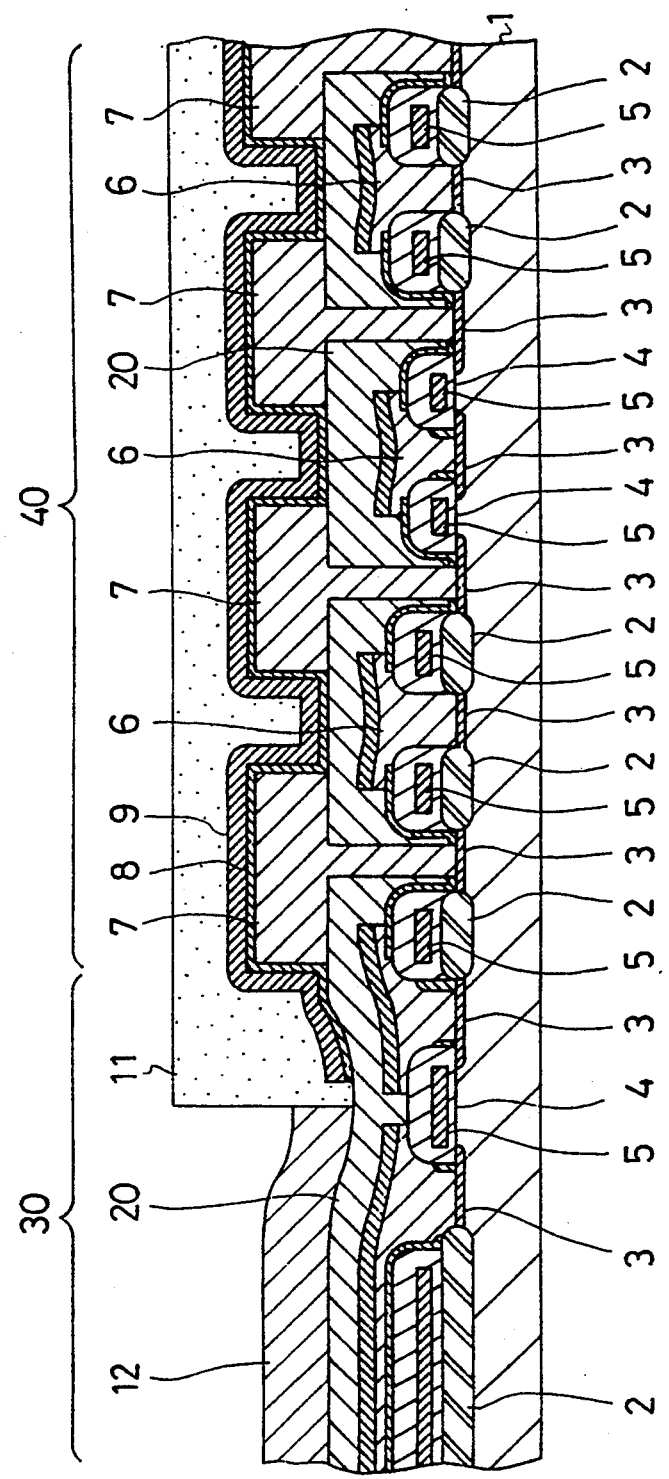

As shown in FIG. 7 and as in the first embodiment, the word line 5, the bit line 6, the charge-storage electrode 7, the capacitor insulator layer 8, and the plate electrode 9 are sequentially formed in the memory cell array region 40 of the semiconductor substrate 1. Then, the resist pattern 11 is formed on the plate electrode 9, leaving the peripheral circuit region 30 exposed.

Next, a silicon dioxide layer 12 (herein after called an LPD. SiO$_2$), which is an insulator layer used to reduce level difference, is selectively grown 500 nm in the peripheral circuit region 30 (i.e., an area where the resist pattern 11 opens) by means of a liquid phase deposition (LPD) method. It is known from IEDM Tech Dig., p. 637, 1991 by K. Kanba et al that the LPD. SiO$_2$ 12 can be formed by selectively growing the insulator layer 20 using the resist pattern 11 as a mask. After this, the resist pattern 11 is removed.

Figure 9:
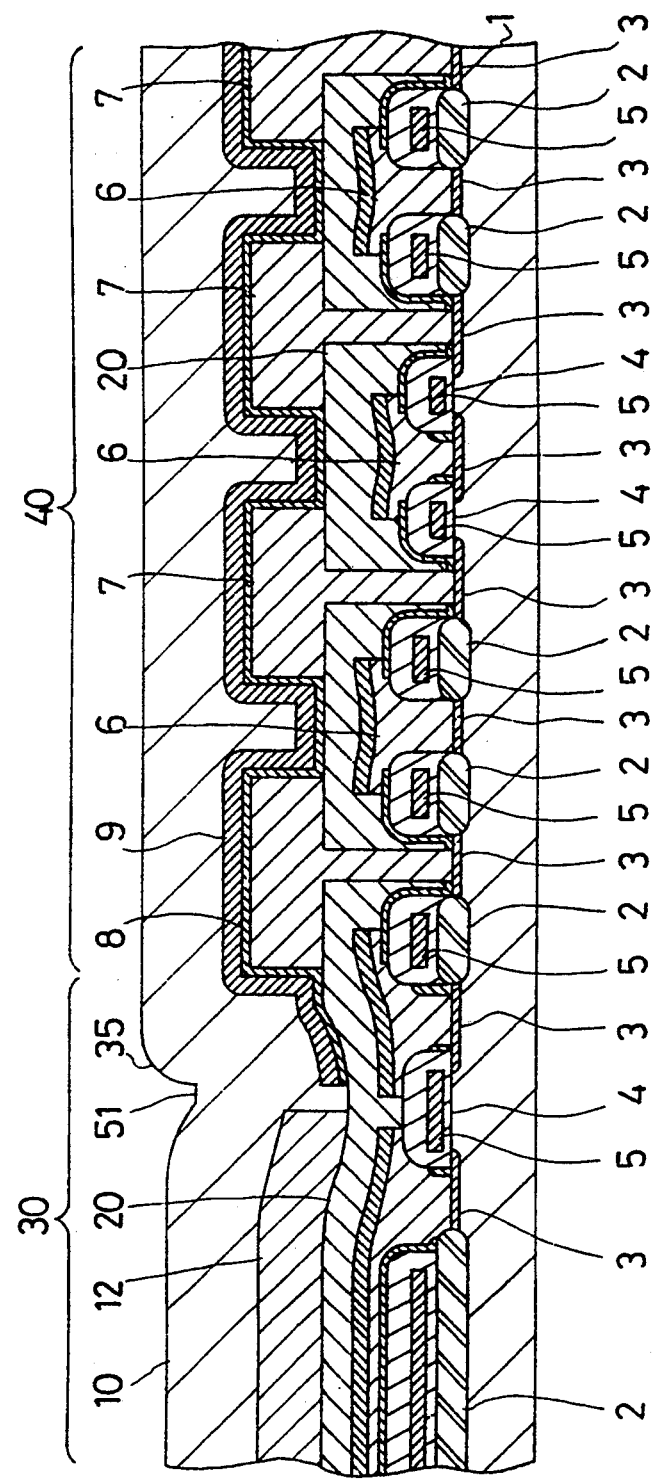

Next, the BPSG film 10 which is an insulator layer that flows upon heating is deposited 1300 nm (see FIG. 9). If the resist pattern 11 is formed such that it juts out in the direction of the peripheral circuit region 30 a bit from the plate electrode's 9 end (see FIG. 8), this permits the recess 51 to be formed at the edge of the peripheral circuit region 30 in such a manner that the memory cell array region 40 is surrounded by such a recess 51 (see FIG. 9). As a result, the steep side 35 enters the recess 51, thereby reducing the flow angle of the steep side 35 when making the BPSG film 10 reflow at a later stage, as in the modification of the first embodiment.

Figure 10:
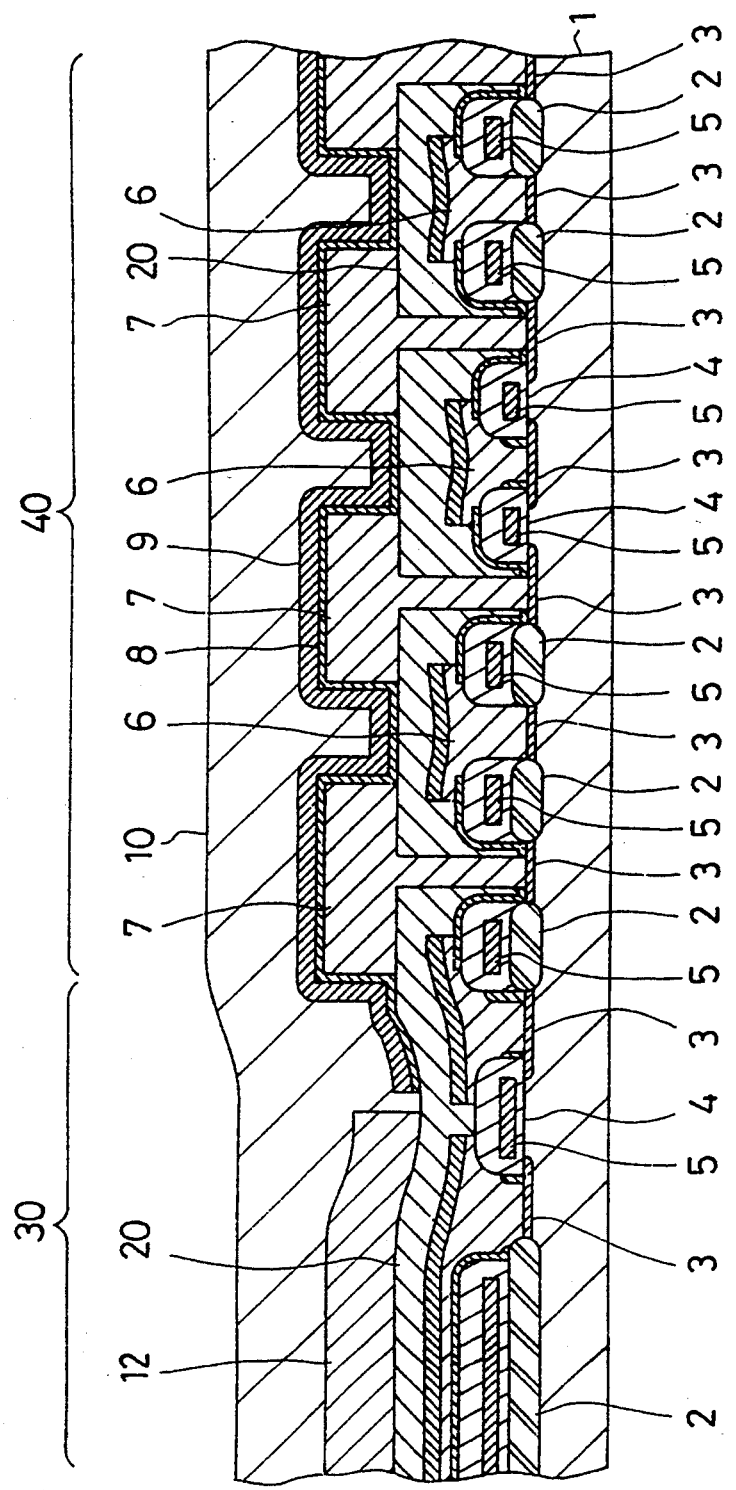
Figure 11:
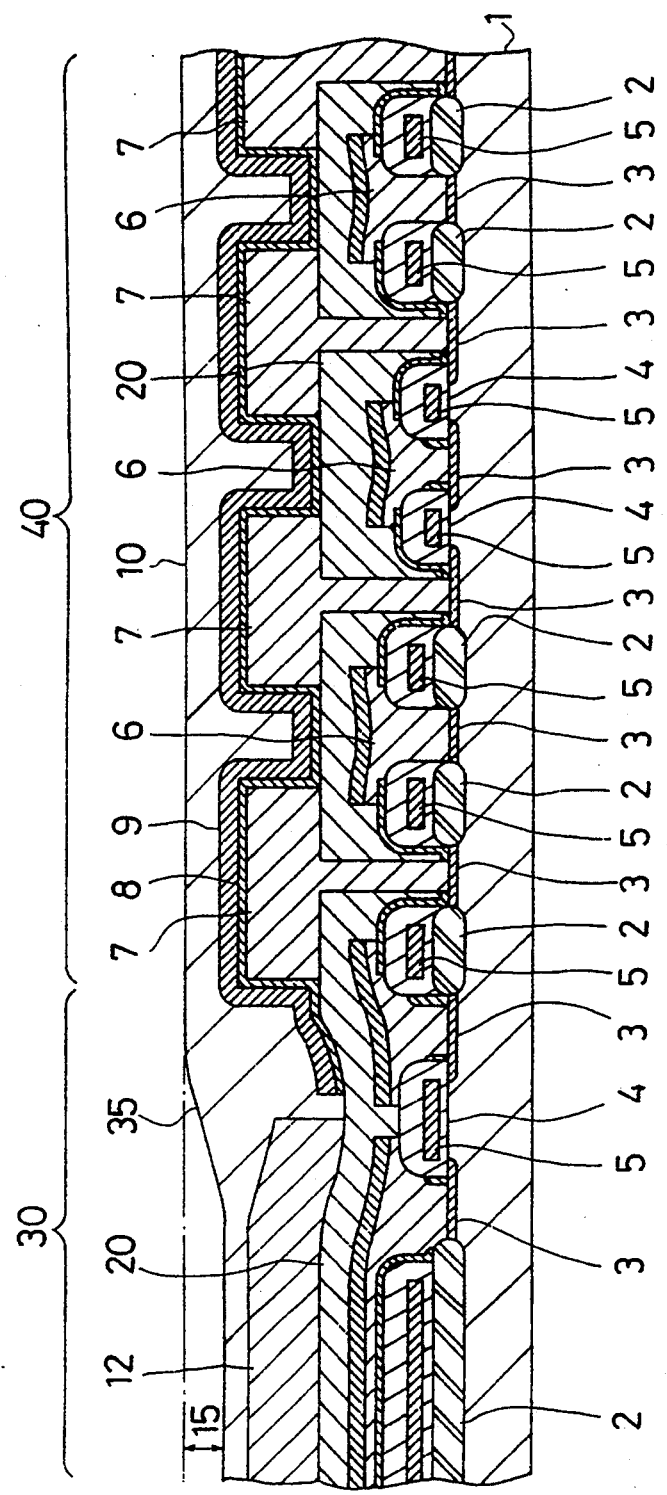

The BPSG film 10 is then subjected to a heat treatment at a temperature of 900° C. in a nitrogen atmosphere for 40 minutes, whereby the BPSG film 10 reflows to planarize (see FIG. 10).

Next, the entire surface of the BPSG film 10 is etched back 500 nm so as to form an interlayer insulator on the plate electrode 9.

As a result of the above-described fabrication steps of the present embodiment, the absolute level difference 15 caused by the presence of the steep step 15 between the memory cell array region 40 and the peripheral circuit region 30 is reduced down to about 500 nm. This makes the formation of wiring patterns at later stages much easier. In this case, it is possible to adjust the absolute level difference 15 by adjusting the film thickness of the SiO$_2$ 12. The SiO$_2$ 12 can have any film thickness as long as the film thickness of the SiO$_2$ 12 falls within the sum of the charge-storage electrode's 7 height and the plate electrode's 9 film thickness. Additionally, the SiO$_2$ 12 may be made flush with the plate electrode 9. In such a case, the entire surface of the BPSG film 10 is etched back 500 nm so as to form an interlayer insulator on the plate electrode 9.

The fabrication of a DRAM of the present embodiment is completed upon completion of metalization by a known technique.

In the second embodiment, the BPSG film 10 undergoes a heat treatment and then is etched back 500 nm. Such an etch-back amount is not to be considered restrictive. Any etch-back amount may be useful as long as it does not ill-influence the formation of metal contacts at a later stage.

By making reference to FIGS. 12–15, a third embodiment of the present invention is explained.

FIGS. 12 to 15 show successive steps of the fabrication of a semiconductor memory device in accordance with the third embodiment.

Figure 12:
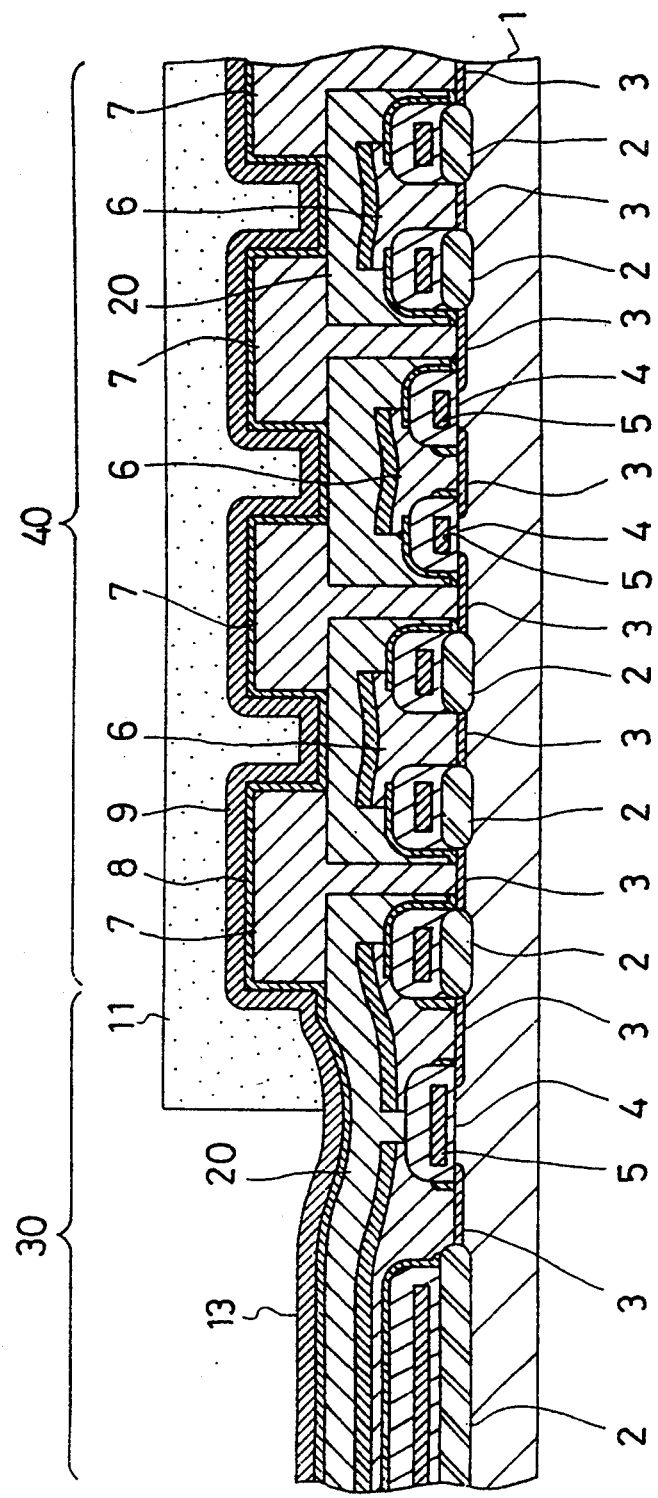

As shown in FIG. 12 and as in the first embodiment, the word line 5, the bit line 6, the charge-storage electrode 7, and the capacitor insulator layer 8 are sequentially formed in the memory cell array region 40. Then, a DPS 13 that becomes the plate electrode 9 is grown 200 nm, and the resist pattern 11 that defines a plate electrode region is formed on the DPS 13.

Figure 13:
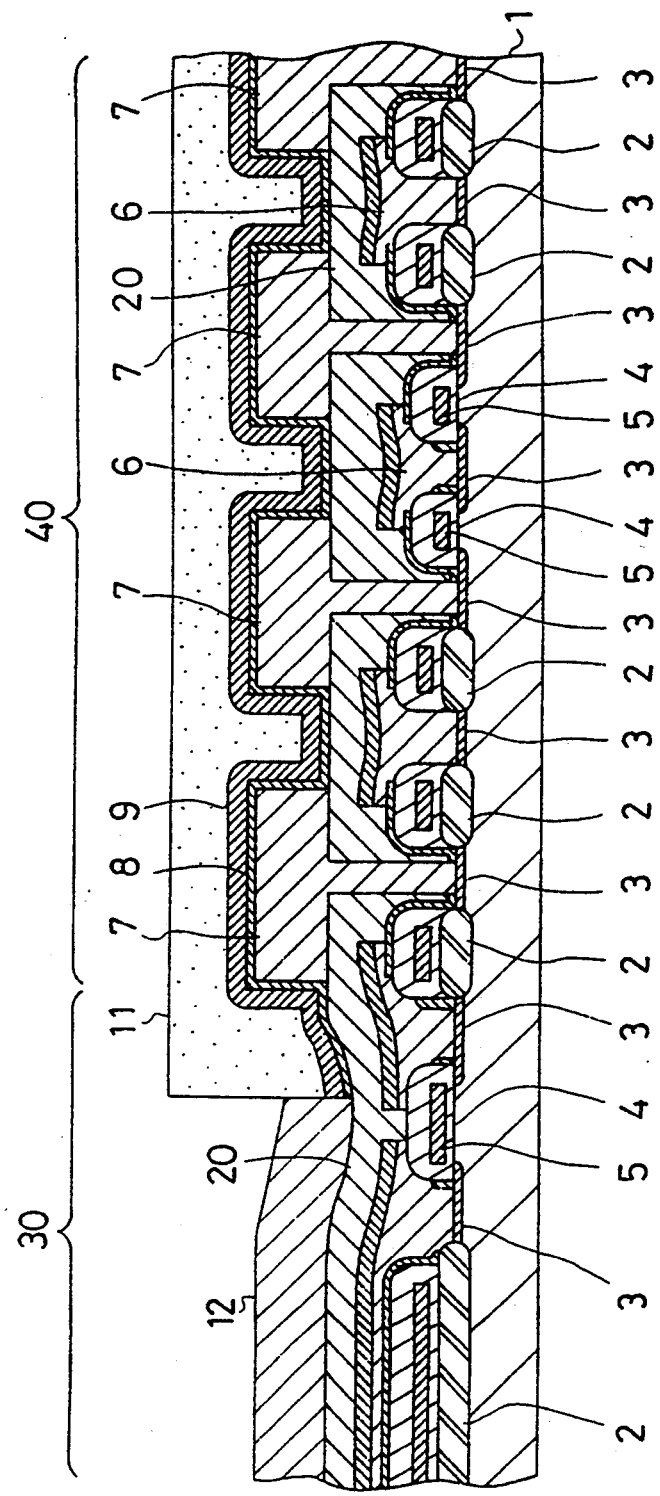

Next, as shown in FIG. 13, using the resist pattern 11 as a mask, the DPS 13 is etched to form the plate electrode 9. Then, still using the resist pattern 11 as a mask, the LPD. SiO$_2$ 12 that is an insulator layer used for a reduction in level difference is selectively grown 500 nm in the peripheral circuit region 30. After this, the resist pattern 11 is removed.

Figure 14:
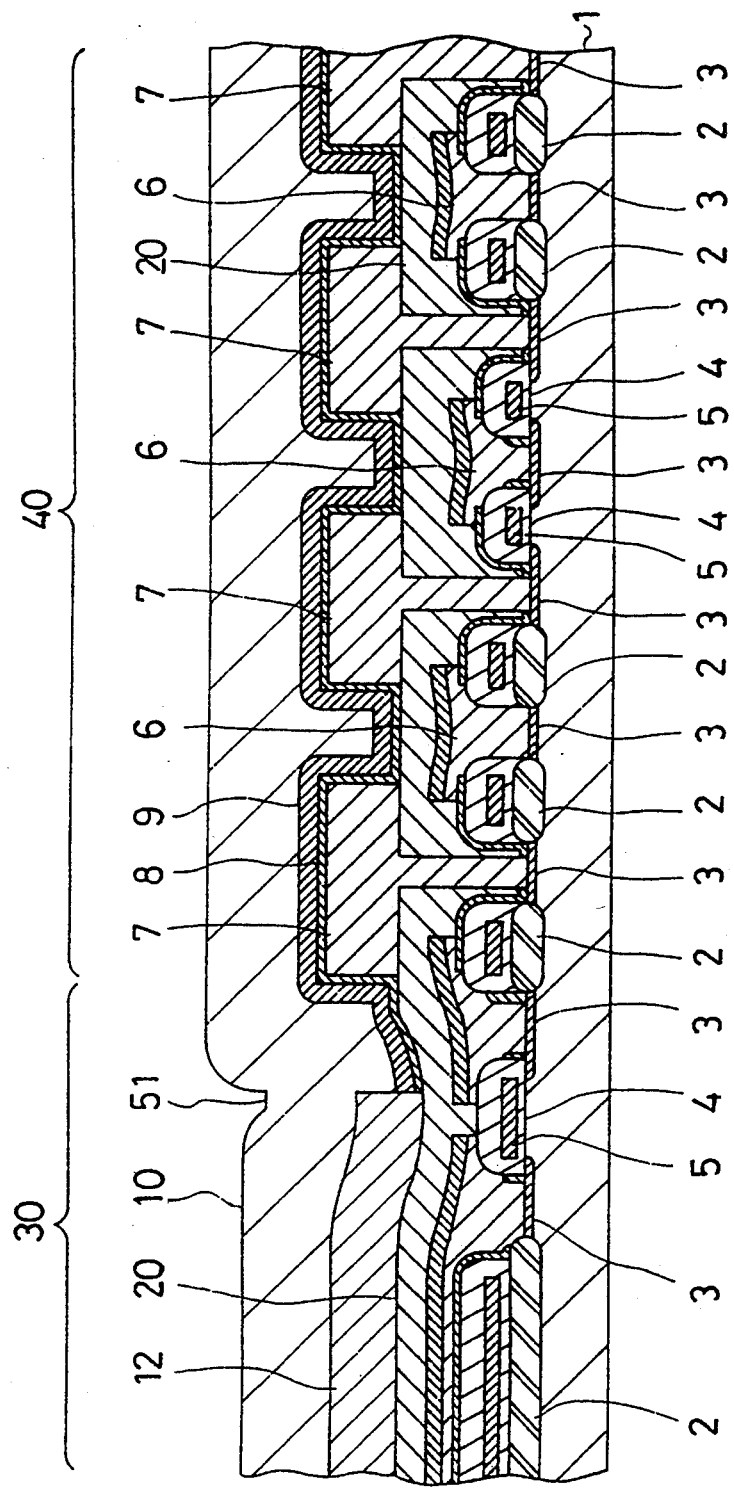

The BPSG film 10 which is an insulator layer that flows upon heating is deposited 1300 nm (see FIG. 14).

Figure 15:
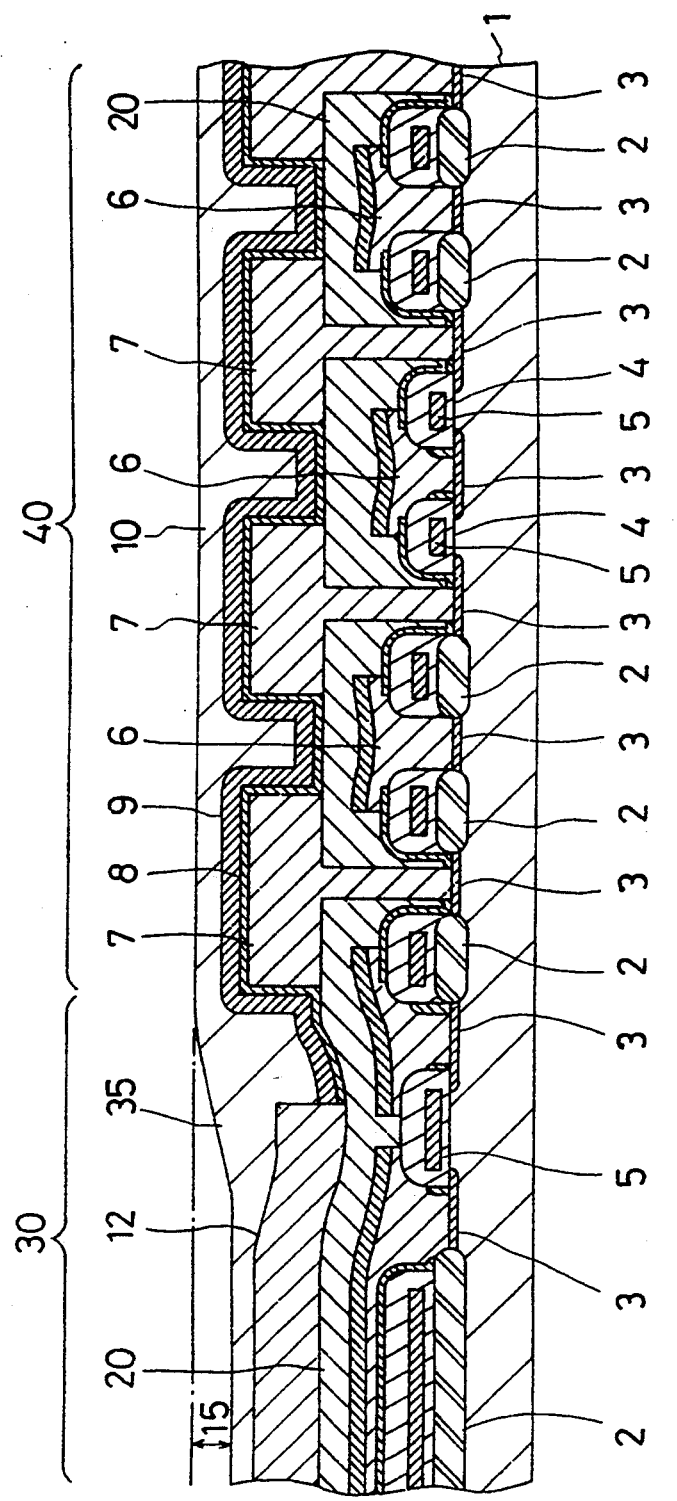
Figure 16:
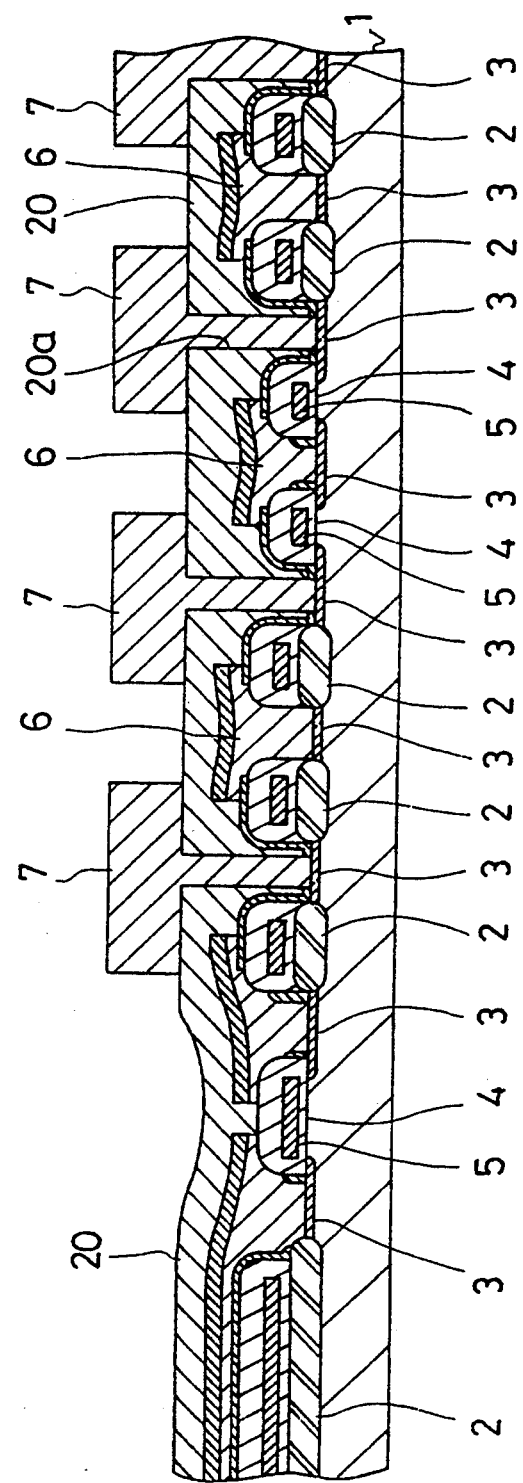
FIGS. 16 and 17 show successive steps of the fabrication of a semiconductor memory device in accordance with a conventional technique.
Figure 17:
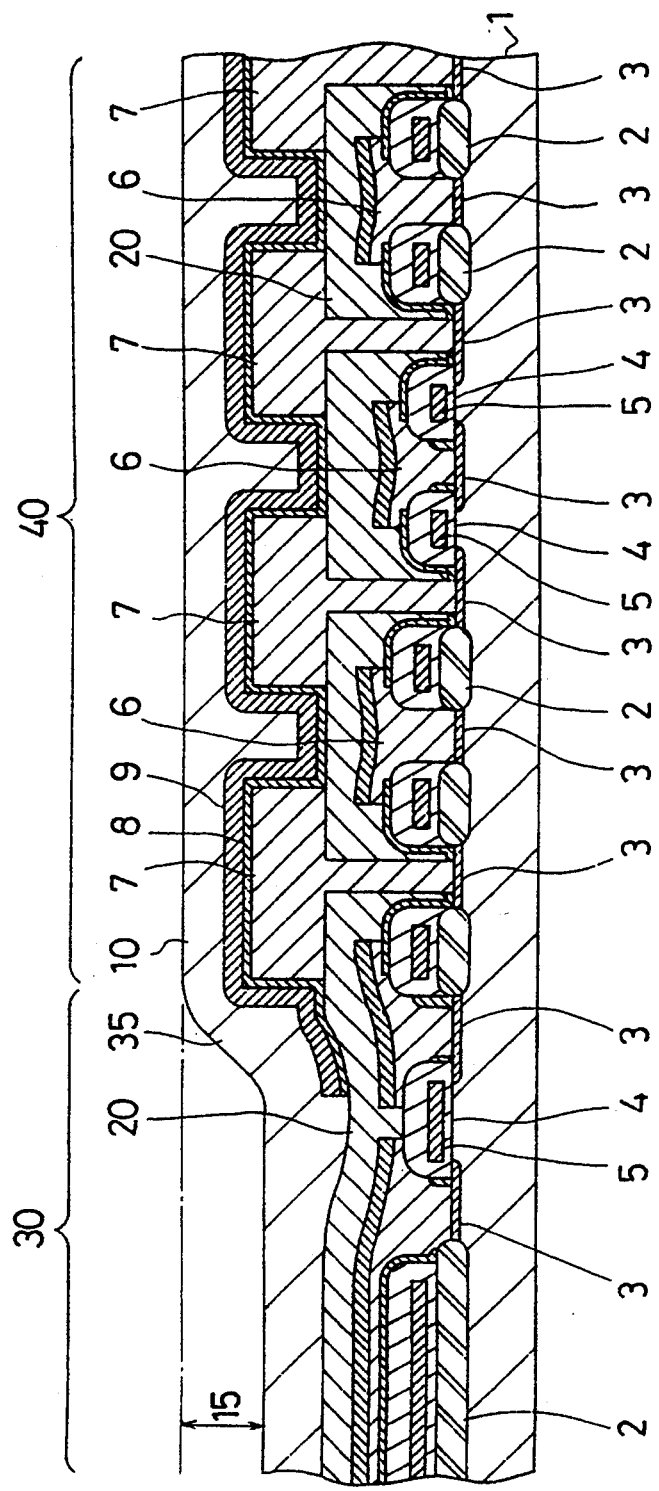
Figure 18:
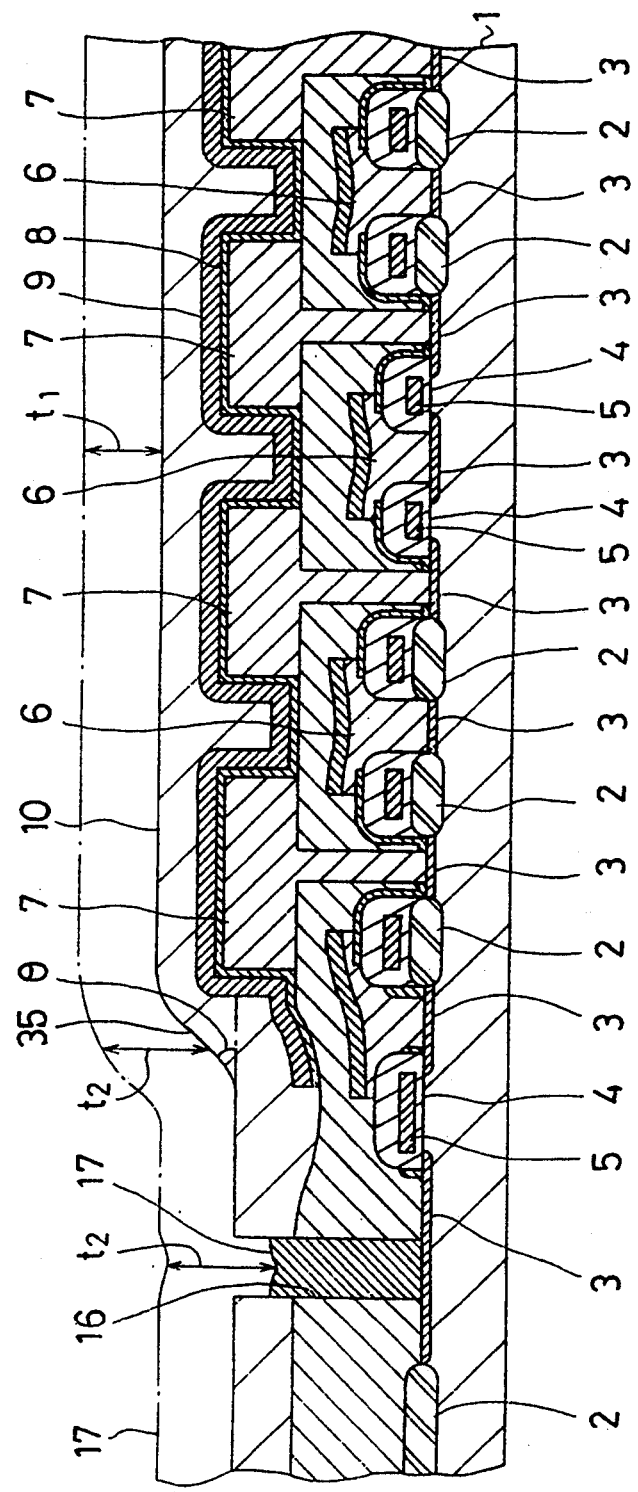
FIGS. 18 and 19 are used to illustrate drawbacks accompanied with conventional semiconductor memory device fabrication techniques.
Figure 19:
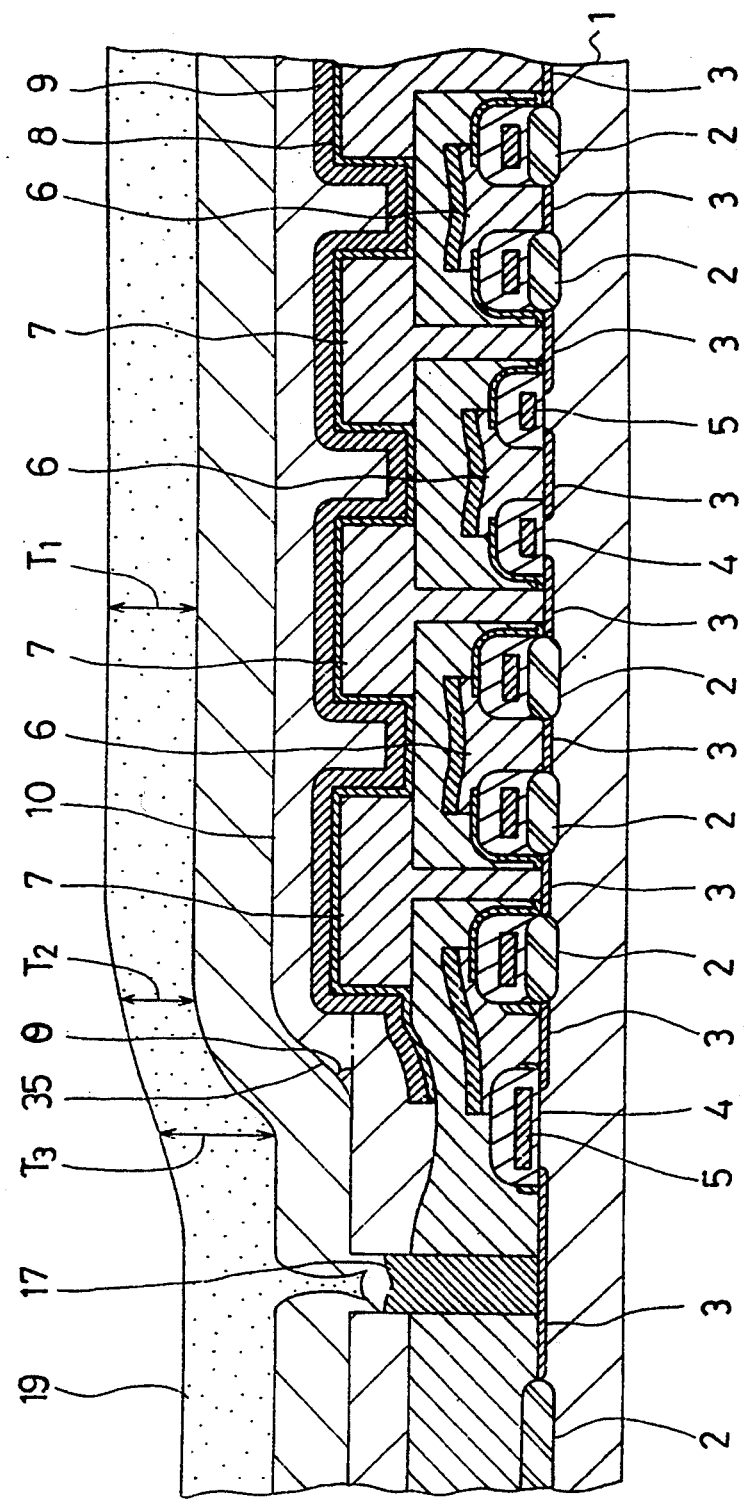

Next, as shown in FIG. 15, the BPSG film 10 is subjected to a heat treatment at a temperature of 900° C. in a nitrogen atmosphere for 40 minutes, whereby the BPSG film 10 reflows to planarize. Thereafter, the entire surface of the BPSG film 10 is etched back 500 nm so as to form an interlayer insulator on the plate electrode 9.

As a result of the above-described fabrication steps of the present embodiment, the absolute level difference 15 caused by the presence of the steep side 35 between the memory cell array region 40 and the peripheral circuit region 30 is reduced down to about 500 nm. This makes the formation of wiring patterns at later stages much easier. In this case, it is possible to adjust the absolute level difference 15 by adjusting the film thickness of the $SiO_2$ 12. The $SiO_2$ 12 can have any film thickness as long as it (the $SiO_2$'s 12 film thickness) falls within the sum of the charge-storage electrode's 7 height and the plate electrode's 9 film thickness. Additionally, the $SiO_2$ 12 may be made flush with the plate electrode 9.

Further, in the present invention, the resist pattern 11 serves also as a mask when selectively growing LPD. $SiO_2$. As a result, without increasing the number of photolithographic steps, the BPSG film 10 can be planarized.

The fabrication of a DRAM of the present embodiment is completed upon completion of metalization by a known technique.

The invention claimed is:

1. A method of fabricating a semiconductor memory device, said method comprising:
   a first step of forming a word line, a bit line, and a charge-storage electrode in a memory cell array region which is formed on a semiconductor substrate;
   a second step of forming a plate electrode over said charge-storage electrode wherein a capacitor insulator layer is sandwiched between said charge-storage electrode and said plate electrode;
   a third step of forming an interlayer insulator that flows upon heating on said memory cell array region as well as on a peripheral circuit region which is formed on said semiconductor substrate;
   a fourth step of forming a resist pattern on said interlayer insulator, leaving said memory cell array region exposed;
   a fifth step of etching said interlayer insulator using said resist pattern as a mask so as to remove only an upper surface portion of said interlayer insulator within said memory cell array region; and
   a sixth step of, after removing said resist pattern, subjecting said interlayer insulator on said memory cell array region and peripheral circuit region to a heat treatment in order that said interlayer insulator reflows.

2. A method of fabricating a semiconductor memory device as in claim 1, wherein said fourth step includes a step of forming said resist pattern in such a way that said interlayer insulator, which lies in said peripheral circuit region and which is formed at said fifth step, has at the edge thereof a projection that surrounds said memory cell array region.

3. A method of fabricating a semiconductor memory device as in claim 2, wherein said fourth step includes a step of forming said resist pattern in such a way that said projection is spaced from said memory cell array region at said fifth step.

4. A method of fabricating a semiconductor memory device as in claim 1, wherein said fourth step includes a step of forming said resist pattern in such a way that said interlayer insulator, which lies in said peripheral circuit region and which is formed at said fifth step, has at the edge thereof a recess that surrounds said memory cell array region.

5. A method of fabricating a semiconductor memory device as in claim 4, wherein said fourth step includes a step of forming said resist pattern in such a way that said recess is spaced from said memory cell array region at said fifth step.

6. A method of fabricating a semiconductor memory device, said method comprising:
   a first step of forming a word line, a bit line, and a charge-storage electrode in a memory cell array region which is formed on a semiconductor substrate;
   a second step of forming a plate electrode over said charge-storage electrode wherein a-capacitor insulator layer is sandwiched between said charge-storage electrode and said plate electrode;
   a third step of forming a resist pattern on said plate electrode, leaving a peripheral circuit region which is formed on said semiconductor substrate exposed;
   a fourth step of forming an insulator layer used for a reduction in level difference in said peripheral circuit region using said resist pattern as a mask;
   a fifth step of, after removing said resist pattern, forming an interlayer insulator that flows upon heating on said memory cell array region as well as on said peripheral circuit region; and
   a sixth step of subjecting said interlayer insulator to a heat treatment in order that said interlayer insulator reflows.

7. A method of fabricating a semiconductor memory device as in claim 6, wherein said level difference reduction insulator layer is a silicon dioxide layer formed by means of a liquid phase epitaxy method.

8. A method of fabricating a semiconductor memory device as in claim 6, wherein said third step includes a step of forming said resist pattern in such a way that said interlayer insulator, which lies in said peripheral circuit region and which is formed at said fifth step, has at the edge thereof a recess that surrounds said memory cell array region.

9. A method of fabricating a semiconductor memory device, said method comprising:
   a first step of forming a word line, a bit line, and a charge-storage electrode in a memory cell array region which is formed on a semiconductor substrate;
   a second step of forming an insulator layer that becomes a capacitor insulator layer in said memory cell array region as well as in a peripheral circuit region which is formed on said semiconductor substrate, and forming a conductive layer that becomes a plate electrode on said insulator layer;
   a third step of forming a plate electrode formation resist pattern on said conductive layer, leaving said peripheral circuit region exposed;
   a fourth step of etching said conductive layer using said resist pattern as a mask so as to form a plate electrode made up of said conductive layer;
   a fifth step of forming an insulator layer used for a reduction in level difference in said peripheral circuit region using said resist pattern as a mask;
   a sixth step of, after removing said resist pattern, forming an interlayer insulator that flows upon heating in said memory cell array region as well as in said peripheral circuit region; and
   a seventh step of subjecting said interlayer insulator to a heat treatment in order that said interlayer insulator reflows.

10. A semiconductor memory fabrication method as in claim 9, wherein said level difference reduction insulator layer is a silicon dioxide layer formed by means of a liquid phase epitaxy method.

11. A semiconductor memory fabrication method as in claim 9, wherein said third step includes a step of forming said resist pattern in such a way that said interlayer insulator, which lies in said peripheral circuit region and which is formed at said fifth step, has at the edge thereof a recess that surrounds said memory cell array region.

* * * * *